(12) United States Patent
Mattela et al.

(10) Patent No.: US 11,641,783 B2
(45) Date of Patent: May 2, 2023

(54) INTERLAYER EXCHANGE COUPLED ADDER

(71) Applicant: Redpine Signals, Inc., San Jose, CA (US)

(72) Inventors: Venkat Mattela, San Jose, CA (US); Sanghamitra Debroy, Hyderabad (IN); Santhosh Sivasubramani, Madurai (IN); Amit Acharyya, Hyderabad (IN)

(73) Assignee: Ceremorphic, Inc., San Jose, CA (US)

( * ) Notice: Subject to any disclaimer, the term of this patent is extended or adjusted under 35 U.S.C. 154(b) by 318 days.

(21) Appl. No.: 17/114,498

(22) Filed: Dec. 8, 2020

(65) Prior Publication Data

US 2022/0181545 A1 Jun. 9, 2022

(51) Int. Cl.
| | |
|---|---|
| *G06F 7/505* | (2006.01) |
| *H01L 43/02* | (2006.01) |
| *H03K 19/20* | (2006.01) |
| *H01L 43/10* | (2006.01) |
| *H01F 10/32* | (2006.01) |

(52) U.S. Cl.
CPC .............. *H01L 43/10* (2013.01); *G06F 7/505* (2013.01); *H01L 43/02* (2013.01); *H01F 10/3286* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 2011/0147816 A1* | 6/2011 | Nikonov | H01L 27/22 257/295 |
| 2020/0051725 A1* | 2/2020 | Xiao | H01L 27/222 |
| 2022/0068970 A1* | 3/2022 | Mattela | H01L 43/10 |

* cited by examiner

*Primary Examiner* — Anh Q Tran
(74) *Attorney, Agent, or Firm* — File-EE-Patents.com; Jay A. Chesavage

(57) ABSTRACT

An adder device for binary magnetic applied fields uses Interlayer Exchange Coupling (IEC) structure where two layers of ferromagnetic material are separated from each other by non-magnetic layers of electrically conductive material of atomic thickness, sufficient to generate anti-magnetic response in a magnetized layer. A set of regions are positioned on a top layer above a continuous bottom layer, and the regions excited with magnetization for A and not A, B and not B, and C and not C to form a sum and an inverse carry output magnetization.

21 Claims, 11 Drawing Sheets

| INPUTS A B C | Inputs to M1 $\overline{A}$ $\overline{B}$ $\overline{C}$ | Output $\overline{M1}$ | Inputs to M2 A B C | Output M2 | Inputs to M3 $\overline{M1}$ C M2 | Output M3(SUM) |
|---|---|---|---|---|---|---|
| 0 0 0 | 1 1 1 | 1 | 0 0 1 | 0 | 1 1 0 | 0 |

Top Layer

Ferromagnetic coupling (J>0)

Anti-ferromagnetic coupling (J<0)

Interlayer Exchange Coupling (IEC) with lateral coupling

Section C-C

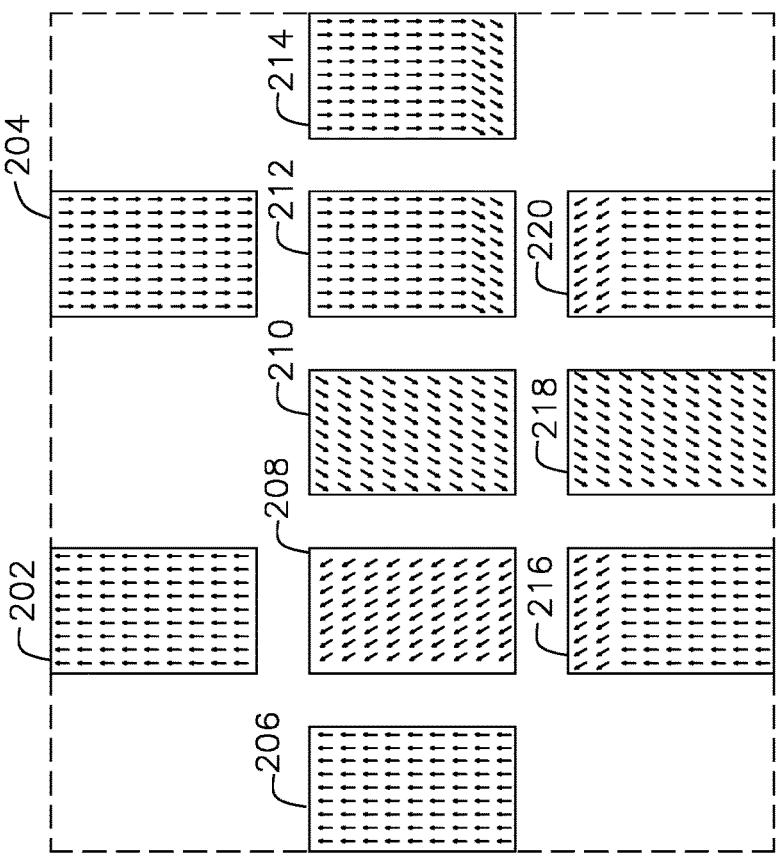
*Figure 4A*
*Figure 4B*
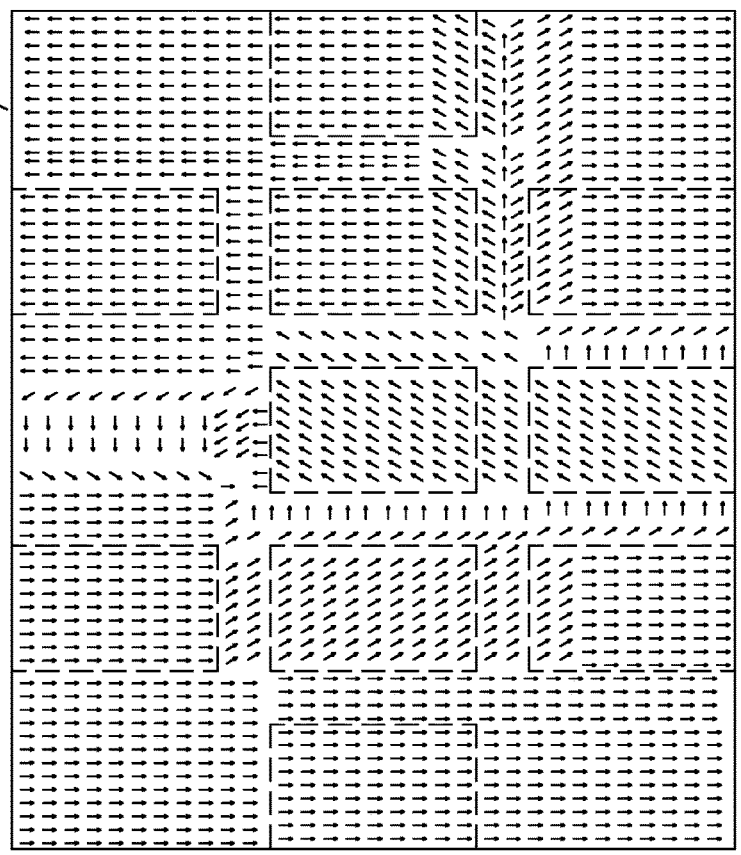
*Figure 4C*

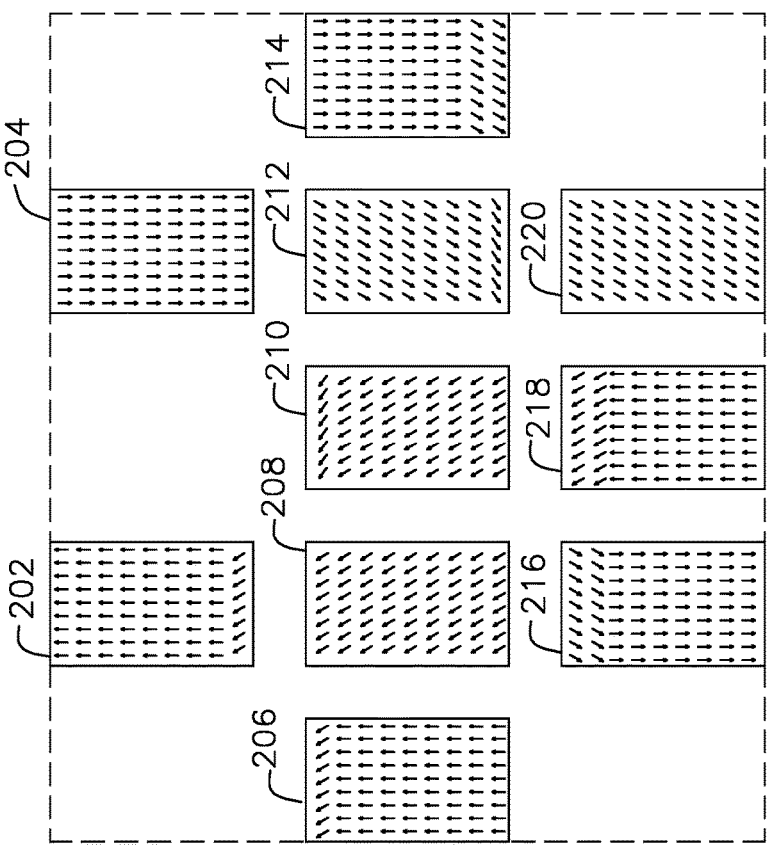
*Figure 5A*
*Figure 5B*
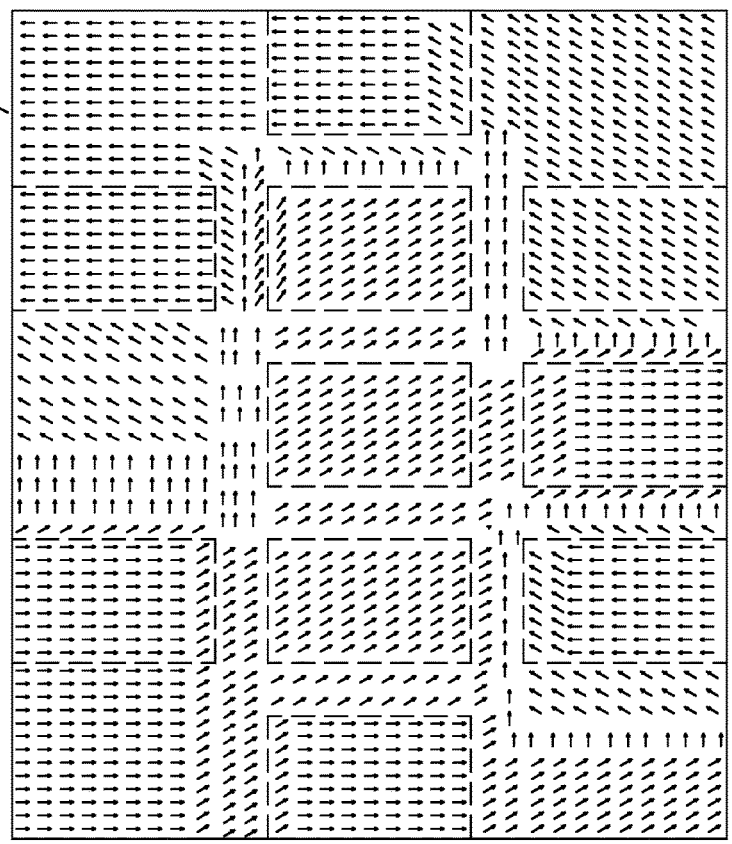
*Figure 5C*

Figure 6A
| INPUTS | | | Inputs to M1 | | Output M1 | Inputs to M2 | | Output M2 | Inputs to M3 | | | Output M3(SUM) |
|---|---|---|---|---|---|---|---|---|---|---|---|---|
| A | B | C | $\overline{A}$ | $\overline{B}$ $\overline{C}$ | $\overline{M1}$ | A B C | | M2 | $\overline{M1}$ | C | M2 | |
| 0 | 1 | 0 | 1 0 | 1 | 1 | 0 1 1 | | 1 | 1 | 0 | 1 | 1 |
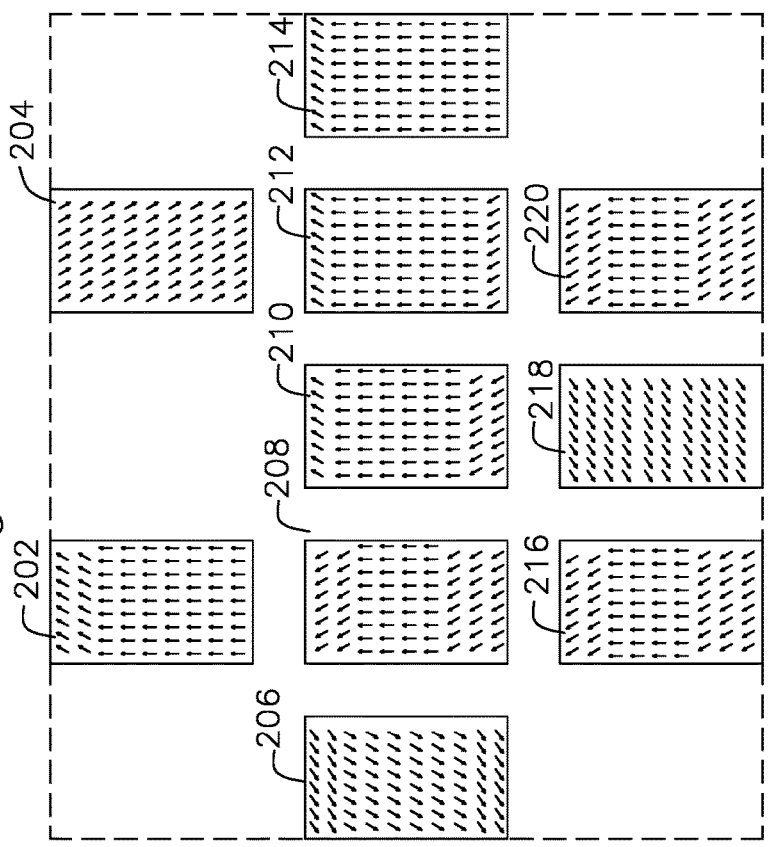
*Figure 6B*
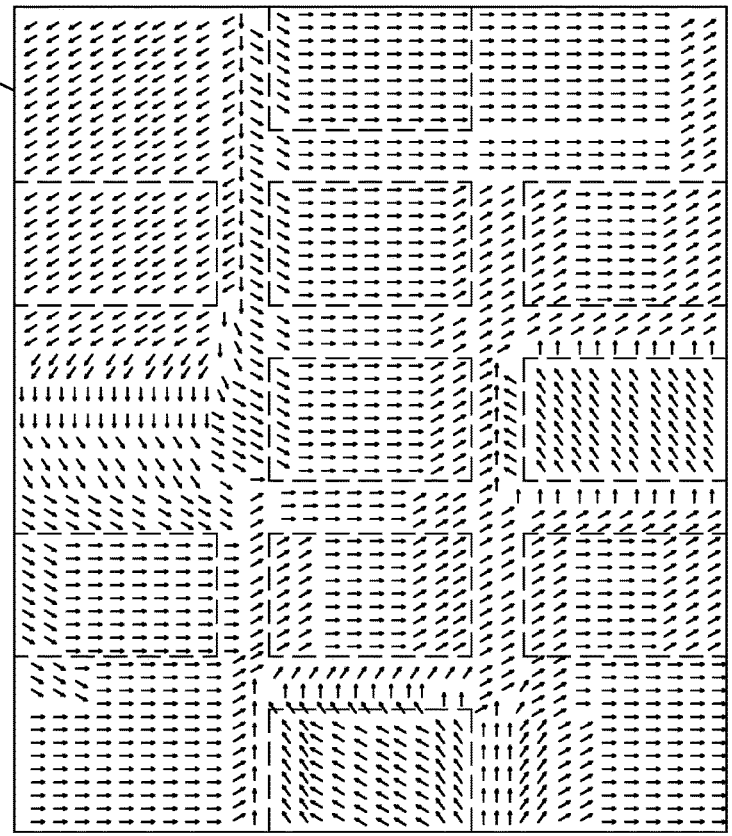
*Figure 6C*

| INPUTS | | | Inputs to M1 | | | Output M1 | Inputs to M2 | | | Output M2 | Inputs to M3 | | | Output M3(SUM) |
|---|---|---|---|---|---|---|---|---|---|---|---|---|---|---|
| A | B | C | $\overline{A}$ | $\overline{B}$ | $\overline{C}$ | $\overline{M1}$ | A | B | $\overline{C}$ | M2 | $\overline{M1}$ | C | M2 | |
| 0 | 1 | 1 | 1 | 0 | 0 | 0 | 0 | 1 | 0 | 0 | 0 | 1 | 0 | 0 |

Figure 7B — Top Layer

Figure 7C — Bottom Layer

Figure 8A
| INPUTS | | | Inputs to M1 | | | Output M1 | Inputs to M2 | | | Output M2 | Inputs to M3 | | | Output M3(SUM) |
|---|---|---|---|---|---|---|---|---|---|---|---|---|---|---|
| A | B | C | $\overline{A}$ | $\overline{B}$ | $\overline{C}$ | $\overline{M1}$ | A | B | $\overline{C}$ | M2 | $\overline{M1}$ | C | M2 | |
| 1 | 0 | 0 | 0 | 1 | 1 | 1 | 1 | 0 | 1 | 1 | 1 | 0 | 1 | 1 |
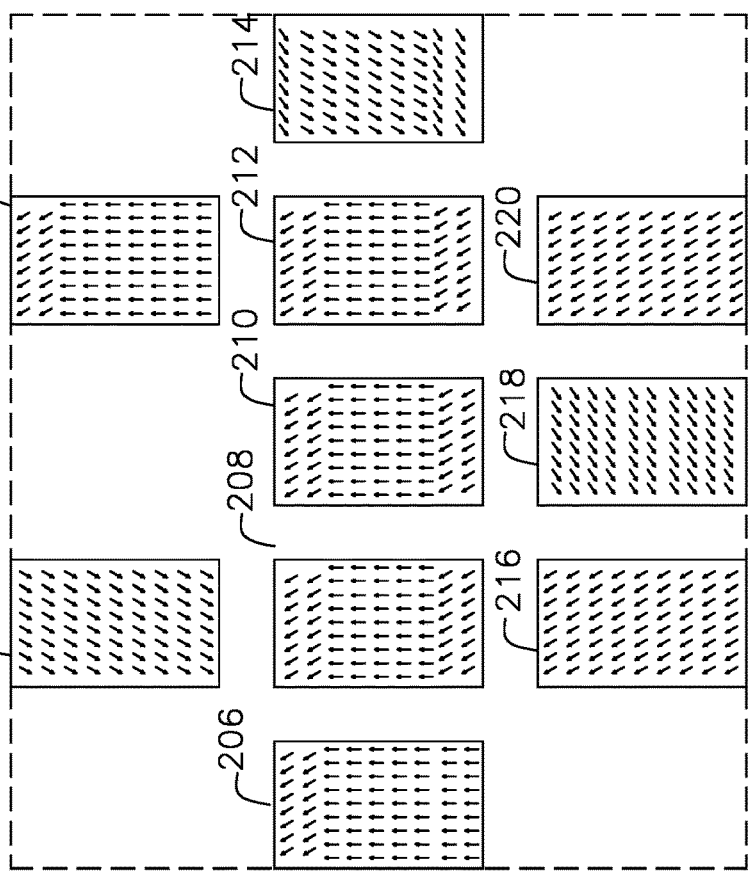
Figure 8B
Top Layer
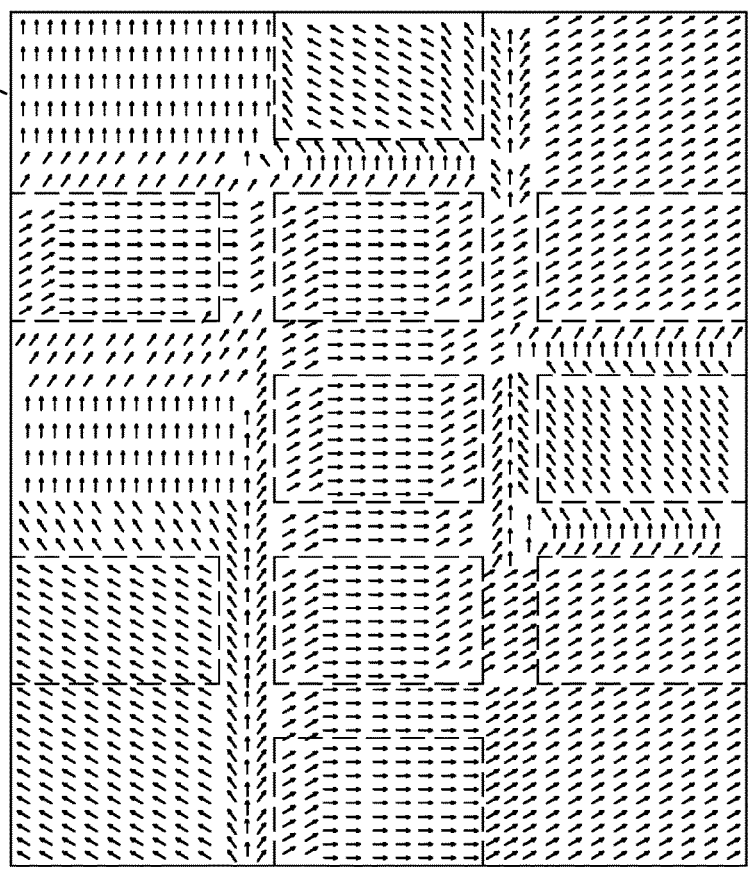
Figure 8C
Bottom Layer

Figure 9A
| INPUTS | | | Inputs to M1 | | | Output M1 | Inputs to M2 | | | Output M2 | Inputs to M3 | | | Output M3(SUM) |
|---|---|---|---|---|---|---|---|---|---|---|---|---|---|---|
| A | B | C | A | B | C | M1 | A | B | C | M2 | M1 | C | M2 | |
| 1 | 0 | 1 | 0 | 1 | 0 | 0 | 1 | 0 | 0 | 0 | 0 | 1 | 0 | 0 |
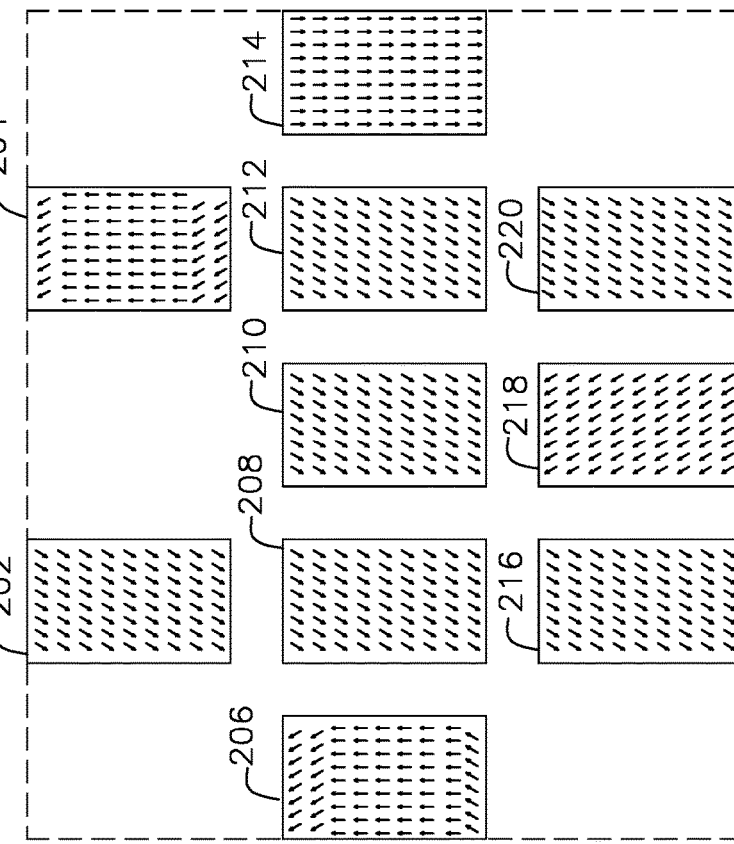
Figure 9B
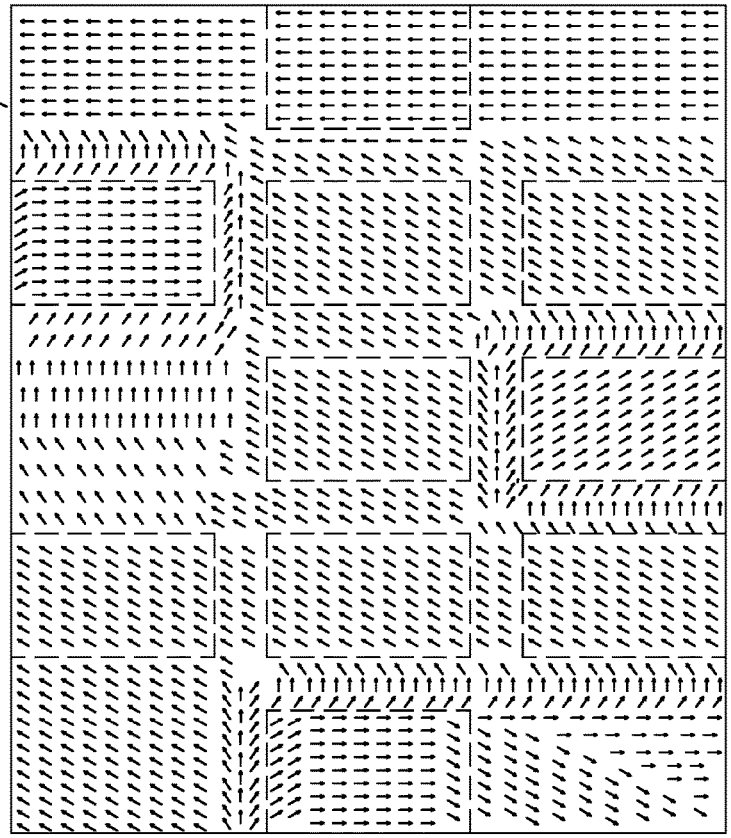
Figure 9C
Top Layer
Bottom Layer

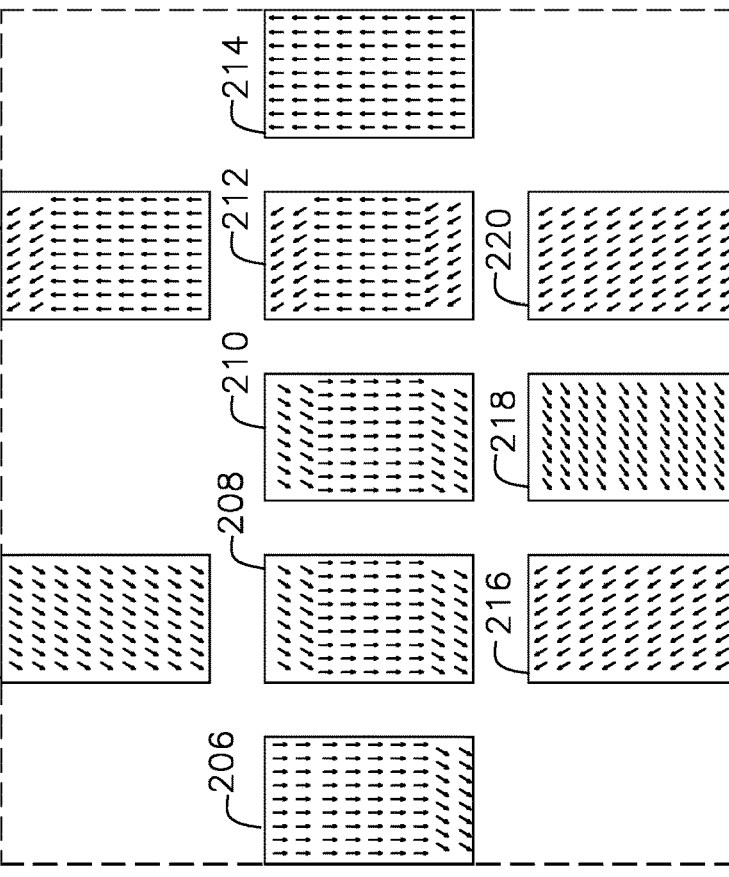
Figure 10A
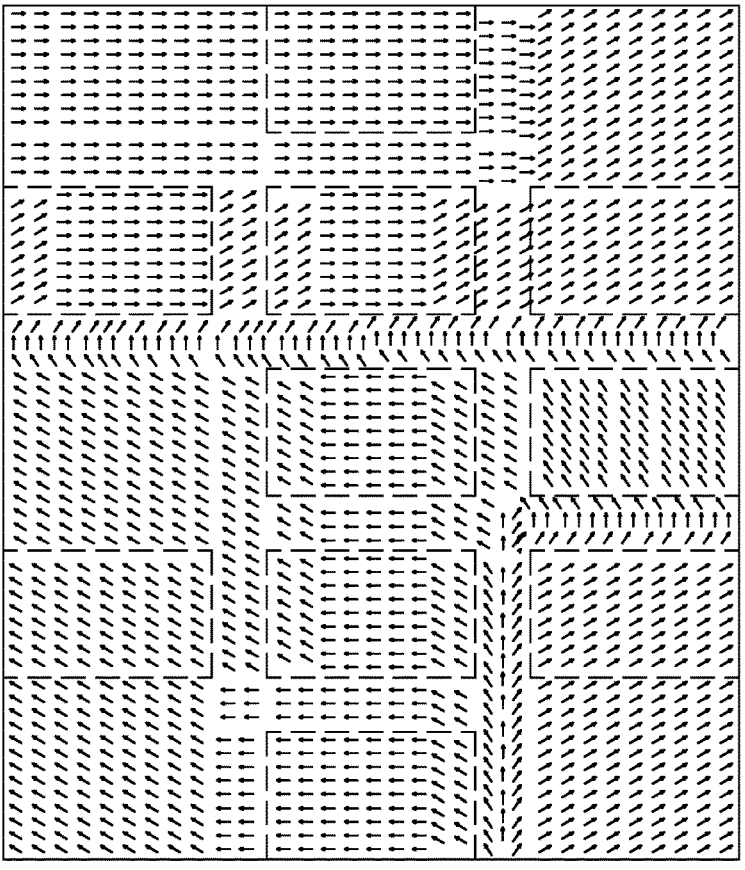
Figure 10B
Figure 10C

Figure 11A
| INPUTS A B C | Inputs to M1 $\overline{A}$ $\overline{B}$ $\overline{C}$ | Output $\overline{M1}$ | Inputs to M2 A B $\overline{C}$ | Output M2 | Inputs to M3 M1 C M2 | Output M3(SUM) |
|---|---|---|---|---|---|---|
| 1 1 1 | 0 0 0 | 0 | 1 1 0 | 1 | 0 1 1 | 1 |
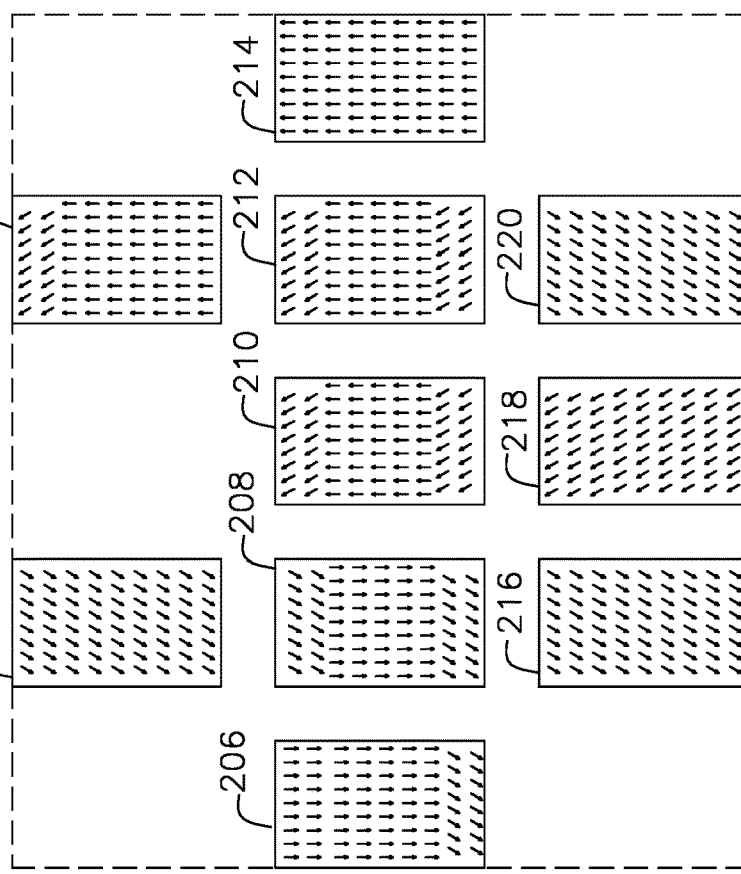
Figure 11B
Top Layer
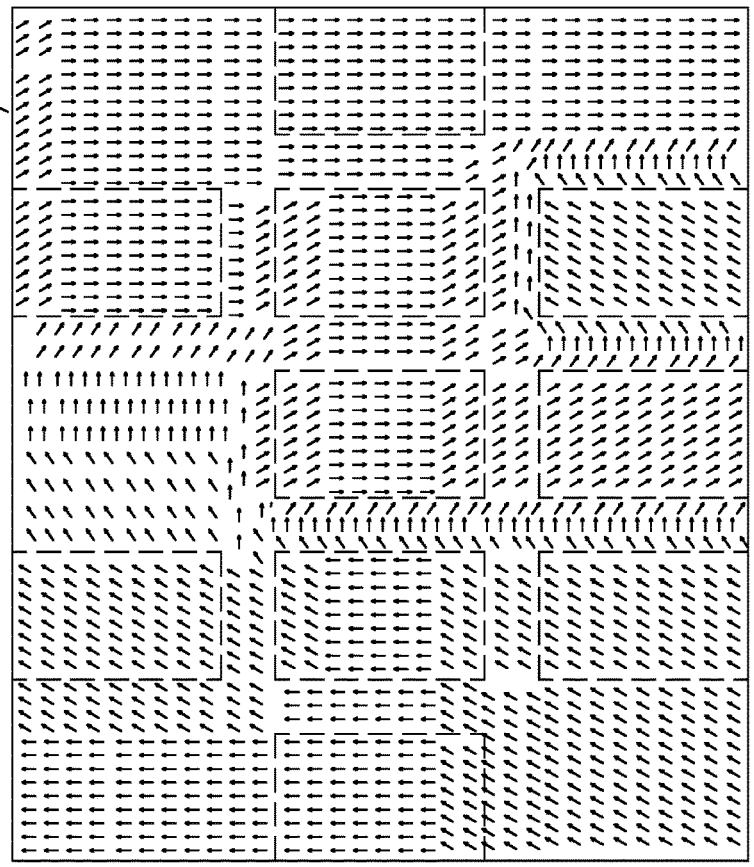
Figure 11C
Bottom Layer

INTERLAYER EXCHANGE COUPLED ADDER

FIELD OF THE INVENTION

The present invention relates to a logical adder. In particular, the invention relates to an Interlayer Exchange Coupling (IEC) adder formed using ferromagnetic layers separated by a spacer layer of thickness sufficient to generate anti-ferromagnetic coupling of magnetic flux across the spacer layer.

BACKGROUND OF THE INVENTION

Various experimental configurations have been composed using the Giant Magneto Resistive (GMR) effect, where a first ferromagnetic layer is separated from a second ferromagnetic layer by a very thin non-magnetic material (typically on the order of several atomic thickness of a conductor such as copper). The GMR effect results in a magnetic field in the plane of one of the ferromagnetic layers generating an anti-ferromagnetic field in the other layer, the anti-ferromagnetic field being co-planar and of opposite sense.

Logic gates have been formed in the prior art using semiconductor technologies, which rely on semiconductor switching characteristics such as transconductance via field effect at an input to form a logic element. A table of common logic functions including: AND, NAND (not AND), OR, and NOR (not OR), as indicated below:

| Input A | Input B | AND Output | NAND output | OR OUTPUT | NOR Output |
|---|---|---|---|---|---|
| 0 | 0 | 0 | 1 | 0 | 1 |
| 0 | 1 | 0 | 1 | 1 | 0 |
| 1 | 0 | 0 | 1 | 1 | 0 |
| 1 | 1 | 1 | 0 | 1 | 0 |

Additionally, a three bit adder has the following characteristic truth table (where '/' indicates logical inversion, as will be described):

TABLE 1

| Input A | Input B | Input C | SUM[1] | /SUM[1] | SUM[0] |
|---|---|---|---|---|---|
| 0 | 0 | 0 | 0 | 1 | 0 |
| 0 | 0 | 1 | 0 | 1 | 1 |
| 0 | 1 | 0 | 0 | 1 | 1 |
| 0 | 1 | 1 | 1 | 0 | 0 |
| 1 | 0 | 0 | 0 | 1 | 1 |
| 1 | 0 | 1 | 1 | 0 | 0 |
| 1 | 1 | 0 | 1 | 0 | 0 |
| 1 | 1 | 1 | 1 | 0 | 1 |

A prior art fabrication for ferromagnetic logic utilizes dipole coupling of regions of ferromagnetic deposition onto a passive substrate. A dimensional limitation of nanoscale construction of these devices is that when the dipole coupled nanomagnets are scaled down to sub 50 nm, the reduction in associated energy barriers required to maintain magnetic state results in increased susceptibility towards soft errors whereby thermal noise causing perturbations of the ferromagnetic material can randomly flip the state of the nanomagnet and corrupt the information stored in it. Therefore, in order to successfully transfer information from one dot to the other the coupling energy between the nanomagnets should also exceed thermal noise. Although these devices work at low temperatures approaching 0° K, thermal noise interfering with the magnetic field orientation until the loss of magnetic properties associated with the material-specific Curie temperature is reached, and the device is no longer able to function. Additionally, when the dipole coupled nanomagnets are scaled down to sub 50 nm, the reduced size of the nanomagnets result in reduction of their energy barriers, which leads to increased susceptibility towards soft errors, where temperature fluctuations randomly flip the state of the nanomagnet and erase the stored information in it. Thus, in order to successfully transfer information from one dot to the other the coupling energy between the nanomagnets should be larger than thermal noise.

It is desired to provide an architecture and structures to perform arithmetic operations such as a three bit adder with carry output, using ferromagnetic films and which operate reliably at room temperatures (25° C.) and above.

OBJECTS OF THE INVENTION

A first object of the invention is a full adder comprising a continuous bottom layer of ferromagnetic material separated from a plurality of regions of ferromagnetic material placed on a parallel plane above the continuous bottom layer by a thin electrically conductive layer sufficient to induce an anti-ferromagnetic response in an opposing layer, the plurality of regions including a central region, an upper region, and a lower region, the central region having, in sequence, a /B input region, an /M1 region, an M3 sum[0] output region, an M2 region, and a B input region; the upper region including an /A region adjacent to the /M1 region and the lower region including a /C region adjacent to the /M1 region and on an opposite side from the /A region; the upper region also including an A input region adjacent to the M2 region and the lower region including a /C region adjacent to the B input region and on an opposite surface of the B input region from the A input.

A second object of the invention is method for forming an addition, the method operative on an adder device comprising:

a continuous bottom layer of ferromagnetic material separated from a plurality of regions of ferromagnetic material placed on a top layer, the top layer being located on a parallel plane above the continuous bottom layer and separated from the continuous bottom layer by a thin electrically conductive non-ferromagnetic layer sufficiently thin to induce an anti-ferromagnetic response in an opposing top layer, the plurality of top layer regions including a central region, an upper region, and a lower region, the central region having, in sequence, a /B input region, an /M1 sum[1] complement region, an M3 sum[0] output region, an M2 region, and a B input region; the upper region including an /A region adjacent to the /M1 region and the lower region including a /C region adjacent to the /M1 region and on an opposite side from the /A region; the upper region also including an A input region adjacent to the M2 region and the lower region including a /C region adjacent to the B input region and on an opposite surface of the B input region from the A input;

the method comprising:

applying individual magnetic fields having a respective polarity to each of the A input region, the B input region, and the C input region;

applying an individual magnetic field of the opposite polarity to the /A input region, /B input region, and /C input region, respectively;

examining the magnetization of at least one of the /M1 region or the M3 region to receive an addition result.

SUMMARY OF THE INVENTION

An Interlayer Exchange Coupling (IEC) logic cell in a first example of the invention comprises a continuous bottom layer of ferromagnetic material, a layer of extremely thin non-magnetic electrically conductive layer placed on the continuous layer of ferromagnetic material, and a plurality of regions of ferromagnetic material positioned on the extremely thin non-magnetic electrically conductive layer, the plurality of regions of ferromagnetic material formed on a top layer. The extremely thin non-magnetic electrically layer is sufficiently thin so as to generates the GMR effect and associated anti-ferromagnetic effect between top layer regions and associated bottom layer ferromagnetic material regions which form superposition magnetic fields in areas where not driven anti-ferromagnetic by the upper layer region. The regions of the top layer include a co-planar central region with a co-planar upper region on one side of the central region and a co-planar lower region on an opposite side of the central region from the upper region. The central region has, in sequence, a /B input region, an /M1 (/SUM[1]) region, an M3 sum[0] region, an M2 region, and a B input region. The upper region has, in sequence, a /A input region adjacent to the /M1 region (also referenced as /SUM[1]) and an A input region. The lower region has, in sequence, a /C input region, a C input region, and a /C input region.

A magnetization of opposite polarity is applied to each of the A input and /A input, the B input and /B input, and C input and /C input. A binary sum (sum[1:0]) may then be read from the M3 region as sum[0] and a complement of the /M1 region as /SUM[1]. The electrically conductive separator can be formed from a thin non-magnetic layer such as copper or other conductor which is a just few atomic thicknesses of copper, or alternatively, sufficiently thin to invoke an anti-ferromagnetic effect between the top layer and bottom layer, where a magnetic polarity applied to the mode input or logic inputs of a region of the top layer results in magnetic polarity of substantially equal magnitude but opposite direction or sense on the opposing layer in a boundary region of the lower layer that is roughly the same extent as a top layer region. Areas of the continuous ferromagnetic bottom layer which are not directly excited by a magnetic field generate a superposition response of the applied ferromagnetic field vectors from surrounding areas. The magnetic polarities applied to the inputs A, B, C, /A, /B, and /C may be generated using any method, including a loop of wire, sheet conductors, or other electromagnetic source which provides a directional magnetic field coplanar to the top layer.

BRIEF DESCRIPTION OF THE DRAWINGS

FIGS. 4A, 5A, 6A, 7A, 8A, 9A, 10A, and 11A show a truth table for the adder indicating the magnetization states of the various input regions, intermediate regions, and output regions.

FIGS. 4B, 5B, 6B, 7B, 8B, 9B, 10B, and 11B show top layer region magnetizations for the associated truth tables 4A, 5A, 6A, 7A, 8A, 9A, 10A, and 11A, respectively.

FIGS. 4C, 5C, 6C, 7C, 8C, 9C, 10C, and 11C show bottom layer magnetizations and superpositions for the associated truth tables 4A, 5A, 6A, 7A, 8A, 9A, 10A, and 11A, respectively.

DETAILED DESCRIPTION OF THE INVENTION

As described in the background of the invention, it is desired to provide a nanomagnetic three input adder device which operates at higher temperatures than the prior art. The Interlayer Exchange Coupled (IEC) topology of the present invention has been shown to offer stronger interaction between thin ferromagnetic layers, resulting in greater scalability and better data retention at the deep sub-micron level, hence allowing magnetic interaction to be manipulated both in the vertical and lateral directions at the same time. According to known scientific approximations, a value indicates as "on the order of" a nominal value is understood to be on the order of magnitude of the nominal value, or in the range one-tenth of the nominal value to ten times the nominal value.

In the present disclosure, by convention, the example logic term A, B, and C are binary magnetization values, and the inverted version may be preceded with a bar above the symbol ($\overline{A}$, $\overline{B}$, $\overline{C}$, respectively), or alternatively a leading slash (/A, /B, /C, respectively). Either the overhead bar or leading slash equivalently denotes a logical inversion of the term, such that if A=1, /A=0 and if A=0, /A=1. The binary magnetization values of '1' and '0' will have magnetization values in generally opposing directions taken as a whole over the associated ferromagnetic regions.

Figure 1A:
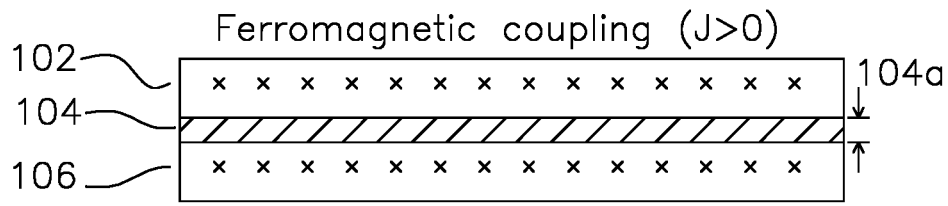
FIG. 1A is a cross section of ferromagnetic material layers separated by a non-magnetic layer of thickness sufficient to invoke a ferromagnetic response.
Figure 1B:
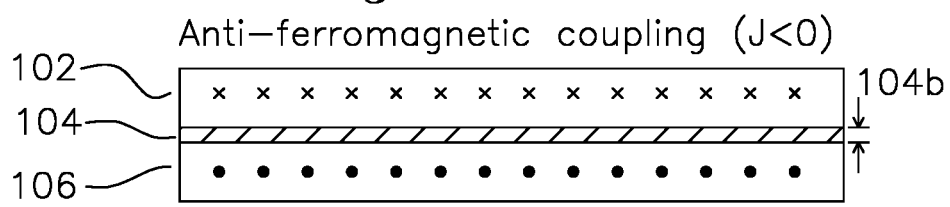
FIG. 1B is a cross section as in FIG. 1A with a thin non-magnetic layer of thickness sufficient to invoke an anti-ferromagnetic response.
Figure 2A:
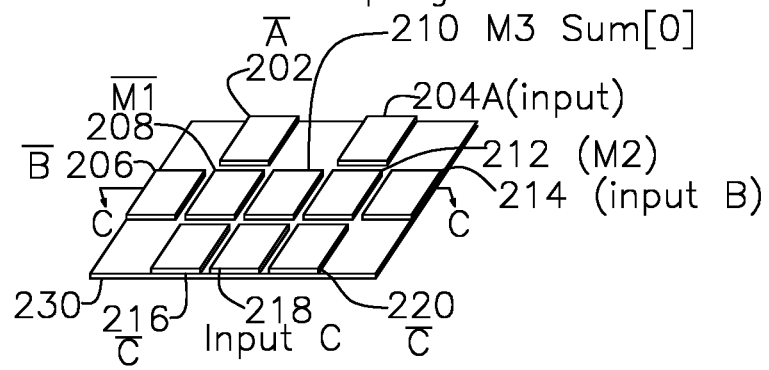
FIG. 2A is a perspective view of a three bit adder according to an example of the invention.
Figure 2B:
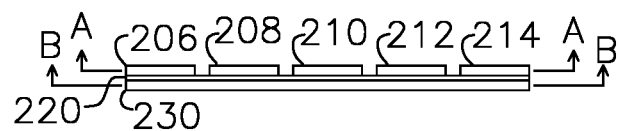
FIG. 2B is a cross section view of section C-C of FIG. 2A.

FIG. 1A shows a first ferromagnetic layer 102 separated from a second ferromagnetic layer 106 by a non-magnetic electrically conductive layer 104 such as copper. Where the non-magnetic layer 104 is too thick 104a to invoke the Giant MagnetoResistive (GMR) effect, the two ferromagnetic layers 102 and 106 couple magnetic field in the same direction, resulting in ferromagnetic coupling shown in FIG. 1A, where the X symbols represent the tail of a magnetic field vector perpendicular to the plane of the figure. When the thickness of the conductive layer 104 is reduced to just a few hundred angstroms thick, or a deposition of thickness on the order of a few atomic thickness, the top and bottom layer demonstrate anti-ferromagnetic coupling, where the magnetic fields are of opposite sense, as shown in FIG. 1B with atomic conductor 104 thickness 104b. FIGS. 2A and 2B show the anti-ferromagnetic effect for an example device with bottom continuous layer 230 and top layer regions 206, 208, 210, 212, and 214, which are co-planar to each other and also to top layer regions 202, 204, 216, 218, and 220 of FIG. 2A. The input regions are A input 204 which is driven with an opposite sense magnetic field from the /A input 202; B input 214, which is driven with an opposite sense magnetic field from /B input 206; and C input 218 which is driven with an opposite sense magnetic field from /C input 216 and 220. Intermediate region M2 212 is operative with the input regions to create superposition fields in the bottom layer that form the adder output regions M3 Sum[0] 210 and /M1 (or /SUM[1]) 208 which is the inverted value Sum[1], each input and output provided in the form of a magnetization.

Figure 2C:
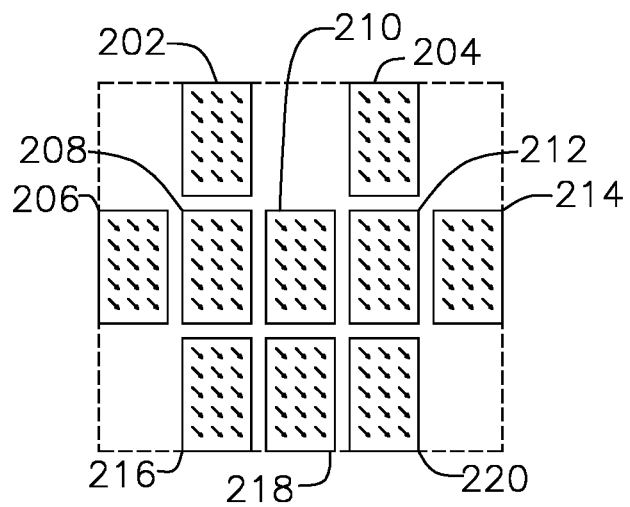
FIG. 2C shows a plan view of an example magnetization of top ferromagnetic layer regions of the three input adder.
Figure 2D:
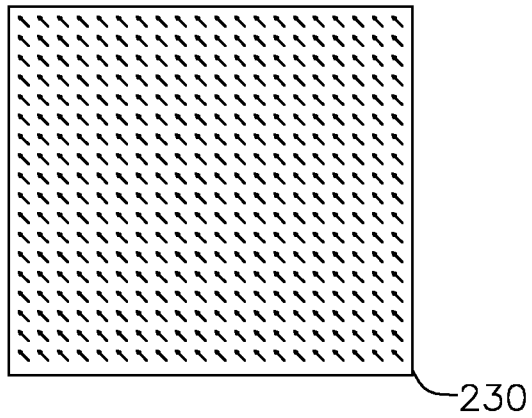
FIG. 2D shows a plan view of the magnetization which results on a bottom continuous ferromagnetic layer of the three input adder in response to the magnetization of FIG. 2C.

FIG. 2C is provided only for understanding the antimagnetic response and is not representative of device operation, since an input C 218 would have an opposite magnetization from inputs /C 216 and 220. For the case where all regions 202, 204, 206, 208, 210, 212, 214, 216, 218, and 220 have the same magnetization as shown, this applied magnetization would result in bottom layer magnetization shown in FIG. 2D bottom layer 230. Undriven input regions can be used to form outputs based on the superposition of magnetic field on the bottom layer generating an anti-ferromagnetic response on a corresponding top region.

Figure 3:
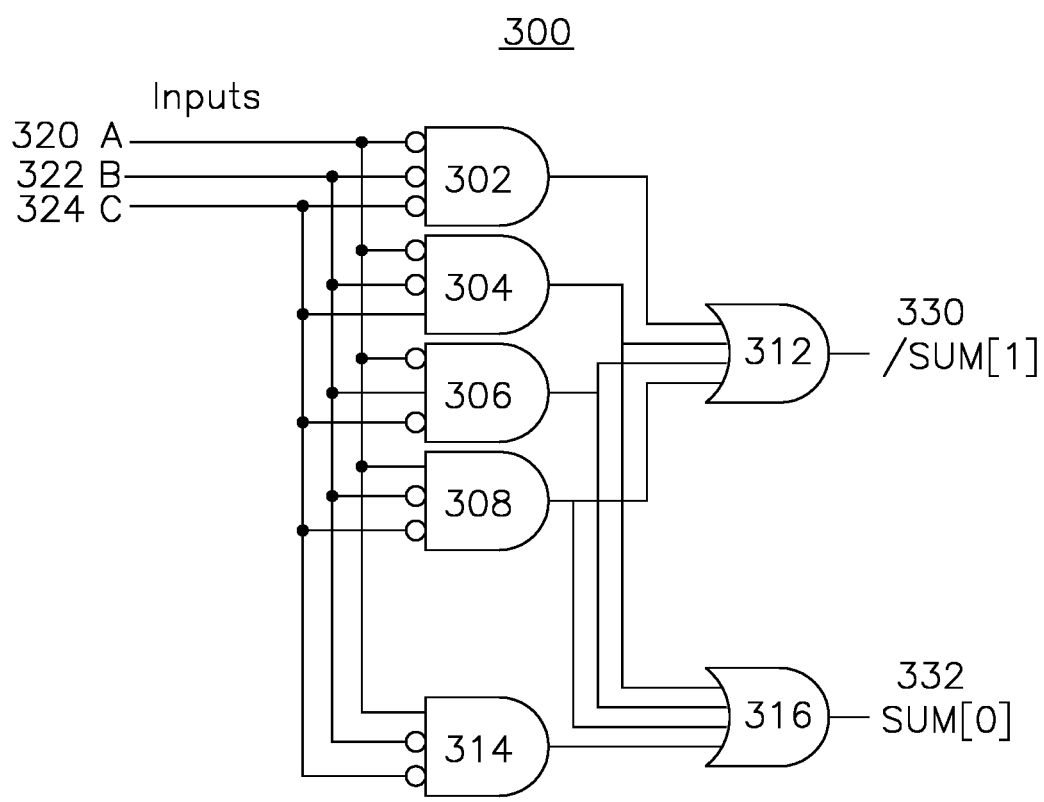
FIG. 3 is a simplified logic diagram for the three input adder.
Figure 7A:
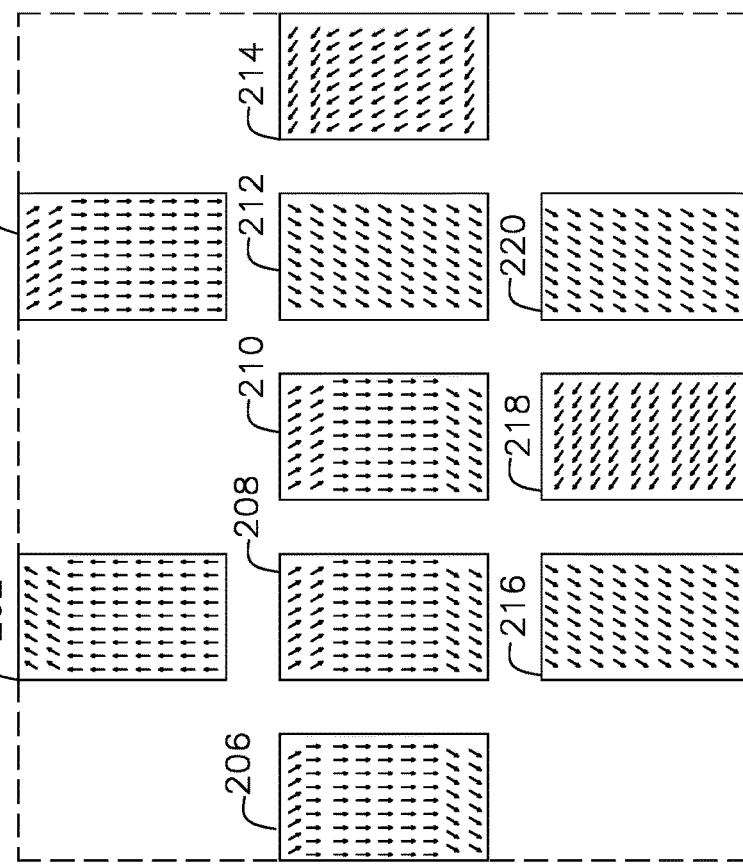
Figure 7A:
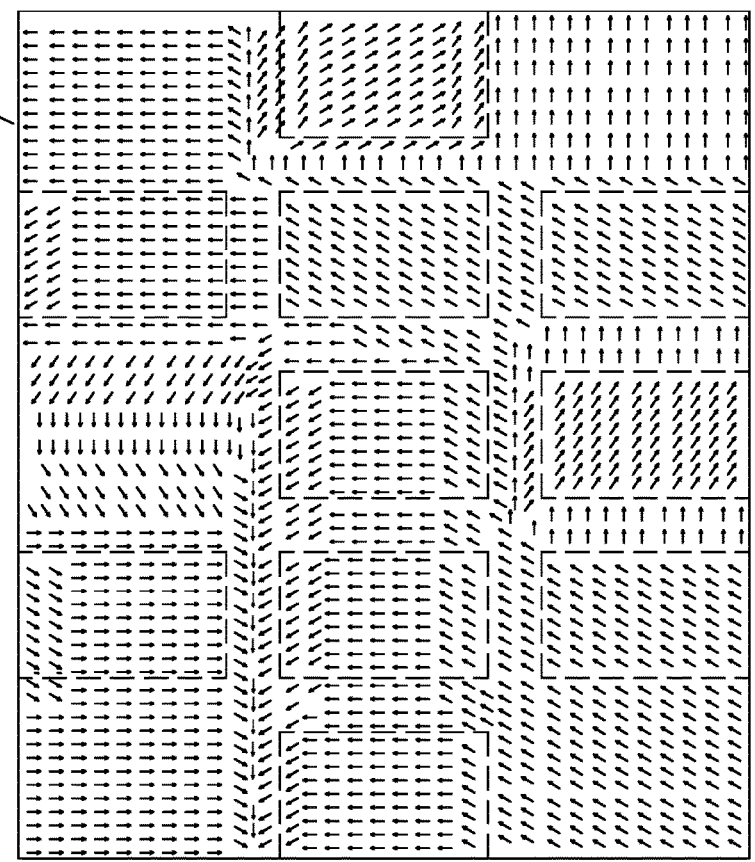

FIG. 3 shows a binary logic diagram for the adder. The AND gates 302, 304, 306, 308, 314 perform a logic AND function, whereby an AND gate output (known as a minterm) is 1 only when all the AND gate inputs are 1, and otherwise the AND gate output is 0. An OR gate such as 312 or 316 only output a 0 when off of the inputs are 0, and otherwise outputs a 1. The circles represent logic inversion upon input (circles to the left of 302). In this example, each AND gate 302, 304, 306, 308 are each responsible for a particular minterm, which are ORed together at 312 to form the /SUM[1] (inverted carry bit), and the output minterms from 304, 306, and 308 are ORed with a minterm from 314. For example, with respect to the /SUM[1] (inverted carry bit) output, and with reference to table 1, the [A B C] values [0 0 0], [0 0 1], [0 1 0], [1 0 0] generate 1 value minterms which are ORed 312 to form the /SUM[1] output of table 1. The last three minterms (outputs 304, 306, 308) and the values [1 0 0] form the fourth minterm applied to OR gate 316 to generate the output SUM[0] corresponding to the column of FIG. 1.

The ferromagnetic regions may be formed from an alloy such as 80% Nickel (Ni) and 20% Iron (Fe), and the conductive non-ferromagnetic layer 104 may be formed of Ruthenium (Ru), Copper (Cu), or other electrically conductive material. The ferromagnetic regions may be formed in a thickness on the order of 5 nm, and of dimensions on the order of 100 nm×100 nm. In one example of the invention, the conductive non-ferromagnetic layer may be in the range 1 nm to 10 nm thickness, or alternatively, on the order of magnitude of 1 nm to 10 nm thickness.

In the present series of figures, it is understood that the particular convention of logic "1" and "0" is arbitrary so long as uniformly applied, but for clarity in understanding the present examples, a "1" will represent a magnetic field pointing generally upwards toward a top edge of the drawings (or a majority of the field direction is upwards) and in the plane of the drawings, and a "0" will represent a magnetic field pointing downwards (or a majority of the field direction is downwards) and in the plane of the drawings. Other conventions are possible, this convention is used only for clarity in understanding the invention.

The devices operate with two magnetization inputs which select the type of logic function performed. The adder inputs have identical response times, and since the magnetization is stored in the ferromagnetic layer until it is changed, the device does not dissipate any power when the magnetic field is not being changed. In general, the magnetic field polarizations of the adder inputs in the top layer establish anti-ferromagnetic responses in the bottom layer with superposition of the magnetic field surrounding the driven regions to provide a desired anti-ferromagnetic polarity in a top ferromagnetic region which is an output such as /M1 (/SUM[1]) or M3 (SUM[0]). The input ferromagnetic layers thereby generate an anti-ferromagnetic response in the bottom ferromagnetic layer, and these anti-ferromagnetic responses generate a superposition of magnetic fields in a region of the bottom layer which is separated from and anti-ferromagnetically coupled to a top layer output ferromagnetic region to form outputs at the various output regions.

The FIGS. 4A, 5A, 6A, 7A, 8A, 9A, 10A, and 11A indicate the input magnetic field excitations applied to the IEC inputs under various logical input combinations, and are understood in combination with the corresponding input region magnetizations 4B, 5B, 6B, 7B, 8B, 9B, 10B, and 11B, respectively, and the superposition magnetic fields as shown in corresponding FIGS. 4C, 5C, 6C, 7C, 8C, 9C, 10C, and 11C, respectively. In each figure, the driven input excitations input A, input /A, input B, input /B, input C, and input /C result in the superposition magnetic fields shown on the corresponding bottom layer, and the superposition of magnetic fields, combined with the anti-magnetic response of the ferromagnetic response result in the SUM[0] output M3 and inverted SUM[1] (/SUM[1]) output /M1.

The present examples are provided for illustrative purposes only, and are not intended to limit the invention to only the embodiments shown.

We claim:

1. An adder comprising:
a continuous bottom layer of ferromagnetic material separated from a plurality of regions of ferromagnetic material positioned on a plane substantially parallel to the continuous bottom layer;
a thin electrically conductive layer positioned between the continuous bottom layer and the plurality of regions of ferromagnetic material, the thin electrically conductive layer sufficient to induce a reciprocal anti-ferromagnetic response between one of the regions of ferromagnetic material to a corresponding coupled area of the continuous bottom layer of ferromagnetic material;
the plurality of regions including a central region, an upper region, and a lower region;
the central region comprising, in sequence: a /B input region, an /M1 region, an M3 sum[0] output region, an M2 region, and a B input region;
the upper region including an /A region adjacent to the /M1 region and the lower region including a /C region adjacent to the /M1 region and on an opposite side from the /A region;
the upper region also including an A input region adjacent to the M2 region and the lower region including a /C region adjacent to the B input region and on an opposite surface of the B input region from the A input;
where a binary magnetization applied to the A input, /A input, B input, /B input, C input, and /C input generates a magnetization of the /M1 region and M3 region corresponding to a binary sum of the A input, B input, and C input.

2. The adder of claim 1 where the /A input has an applied magnetization which is opposite an applied magnetization of the A input.

3. The adder of claim 1 where the /B input has an applied magnetization which is opposite an applied magnetization of the B input.

4. The adder of claim 1 where the /C input has an applied magnetization which is opposite an applied magnetization of the C input.

5. The adder of claim 1 where the continuous bottom layer, in response to an upper region magnetization, generates an anti-ferromagnetic superposition response which is coupled to an upper region which does not have an applied magnetization.

6. The adder of claim 1 where the ferromagnetic material is at least one of an alloy of 80% Ni and 20% Fe.

7. The adder of claim 1 where the ferromagnetic material has a thickness on the order of 1 nm or on the order of 10 nm.

8. The adder of claim 1 where the non-ferromagnetic electrical conductor is Copper or Ruthenium.

9. The adder of claim 1 where the electrical conductor is a non-ferromagnetic material.

10. The adder of claim 9 where the electrical conductor has a thickness on the order of 5 nm.

11. The adder of claim 1 where at least one of the plurality of regions has a rectangular shape.

12. An adder comprising, in sequence:
   a continuous bottom layer of ferromagnetic material;
   a thin layer of electrically conductive material;
   a plurality of regions of ferromagnetic material;
   the thin layer of electrically conductive material sufficient to induce an anti-ferromagnetic response between one of the regions of ferromagnetic material to the continuous bottom layer of ferromagnetic material;
   the plurality of regions including a central region, an upper region, and a lower region;
   the central region comprising, in sequence: a /B input region, an /M1 region, an M3 sum[0] output region, an M2 region, and a B input region;
   the upper region including an /A region adjacent to the /M1 region and the lower region including a /C region adjacent to the /M1 region and on an opposite side from the /A region;
   the upper region also including an A input region adjacent to the M2 region and the lower region including a /C region adjacent to the B input region and on an opposite surface of the B input region from the A input;
   where respective binary magnetizations applied to each of the A input region, /A input region, B input region, /B input region, C input region, and /C input region generates a magnetization of the /M1 region and M3 region corresponding to a binary sum of the A input region, B input region, and C input region.

13. The adder of claim 12 where the /A input region has an applied magnetization which is opposite an applied magnetization of the A input region.

14. The adder of claim 12 where the /B input region has an applied magnetization which is opposite an applied magnetization of the B input region.

15. The adder of claim 12 where the /C input region has an applied magnetization which is opposite an applied magnetization of the C input region.

16. The adder of claim 12 where the ferromagnetic material is at least one of an alloy of 80% Ni and 20% Fe.

17. The adder of claim 12 where the ferromagnetic material has a thickness on the order of 1 nm or on the order of 10 nm.

18. The adder of claim 12 where the non-ferromagnetic electrical conductor is Copper or Ruthenium.

19. The adder of claim 1 where the electrical conductor is a non-ferromagnetic material.

20. The adder of claim 9 where the electrical conductor has a thickness on the order of 5 nm.

21. The adder of claim 1 where at least one of the plurality of regions has a rectangular shape.

* * * * *